United States Patent [19]
Marrs

[11] Patent Number: 5,701,034
[45] Date of Patent: Dec. 23, 1997

[54] PACKAGED SEMICONDUCTOR DIE INCLUDING HEAT SINK WITH LOCKING FEATURE

[75] Inventor: Robert C. Marrs, Scottsdale, Ariz.

[73] Assignee: Amkor Electronics, Inc., Chandler, Ariz.

[21] Appl. No.: 237,709

[22] Filed: May 3, 1994

[51] Int. Cl.⁶ .......................... H01L 23/10; H01L 23/34
[52] U.S. Cl. .......................... 257/706; 257/707; 257/787
[58] Field of Search .......................... 257/706, 707, 257/787

[56] References Cited

U.S. PATENT DOCUMENTS

| | | |
|---|---|---|
| 3,564,352 | 2/1971 | Lehner . |
| 3,838,984 | 10/1974 | Crane et al. . |
| 4,074,342 | 2/1978 | Honn et al. . |
| 4,105,861 | 8/1978 | Hascoe . |
| 4,168,507 | 9/1979 | Yester, Jr. . |
| 4,410,927 | 10/1983 | Butt . |
| 4,461,924 | 7/1984 | Butt . |
| 4,480,262 | 10/1984 | Butt . |
| 4,594,770 | 6/1986 | Butt . |
| 4,680,613 | 7/1987 | Daniels et al. . |
| 4,701,999 | 10/1987 | Palmer . |
| 4,737,395 | 4/1988 | Mabuchi et al. . |
| 4,769,344 | 9/1988 | Sakai et al. . |
| 4,773,955 | 9/1988 | Mabuchi et al. . |
| 4,835,120 | 5/1989 | Mallik et al. . |
| 4,868,349 | 9/1989 | Chia . |
| 4,872,047 | 10/1989 | Fister et al. . |
| 4,888,449 | 12/1989 | Crane et al. . |
| 4,890,152 | 12/1989 | Hirata et al. . |
| 4,891,687 | 1/1990 | Mallik et al. . |
| 4,943,844 | 7/1990 | Oscilowski et al. . |
| 4,949,220 | 8/1990 | Tashiro . |
| 4,974,057 | 11/1990 | Tazima . |
| 4,975,761 | 12/1990 | Chu . |
| 4,994,897 | 2/1991 | Golubic et al. . |
| 4,994,936 | 2/1991 | Hernandez . |
| 5,041,902 | 8/1991 | McShane .......................... 257/706 |
| 5,102,828 | 4/1992 | Marchisi . |
| 5,172,214 | 12/1992 | Casto . |
| 5,202,288 | 4/1993 | Doering et al. . |
| 5,235,211 | 8/1993 | Hamburgen .......................... 257/706 |
| 5,278,446 | 1/1994 | Nagaraj et al. .......................... 257/706 |
| 5,294,828 | 3/1994 | Okumura .......................... 257/706 |

FOREIGN PATENT DOCUMENTS

| | | | |
|---|---|---|---|
| 57-45959 | 3/1982 | Japan | 257/796 |
| 61-39555 | 2/1986 | Japan | 257/796 |
| 63-205935 | 8/1988 | Japan | 257/796 |
| 63-233555 | 9/1988 | Japan | 257/796 |
| 64-47058 | 2/1989 | Japan | 257/706 |
| 1146346 | 6/1989 | Japan | 257/696 |
| 43450 | 1/1992 | Japan | 257/787 |

*Primary Examiner*—Mahshid D. Saadat
*Assistant Examiner*—S. V. Clark
*Attorney, Agent, or Firm*—Skjerven, Morrill, MacPherson, Franklin, & Friel LLP; Alan H. MacPherson; Thomas S. MacDonald

[57] ABSTRACT

A packaged semiconductor die includes a heat sink having a locking feature that interlocks with the encapsulant encapsulating the die to minimize or eliminate delamination of the encapsulant from the heat sink. A surface of the heat sink can be exposed to the exterior of the encapsulant. The invention applies broadly to packaged integrated circuits including multichip modules and hybrid circuits, as well as to packaged transistors. In one embodiment of the invention, a locking moat has a cross-sectional shape that has, at a first distance beneath a locking surface of the heat sink, a width that is larger than a width at a second distance beneath the locking surface, the second distance being smaller than the first distance. The locking moat can have, for example, a "keyhole" cross-sectional shape or a circular cross-sectional shape. The locking moat can be formed by, for example, stamping or chemical etching. In another embodiment of the invention, the locking feature is a locking region. The locking region can be, for example, a plurality of dimples or deep holes formed by, for instance, stamping, grinding, mechanical or laser drilling, or chemical etching, a roughened area formed by abrading or selective electroplating, or a patterned region formed by coining.

13 Claims, 10 Drawing Sheets

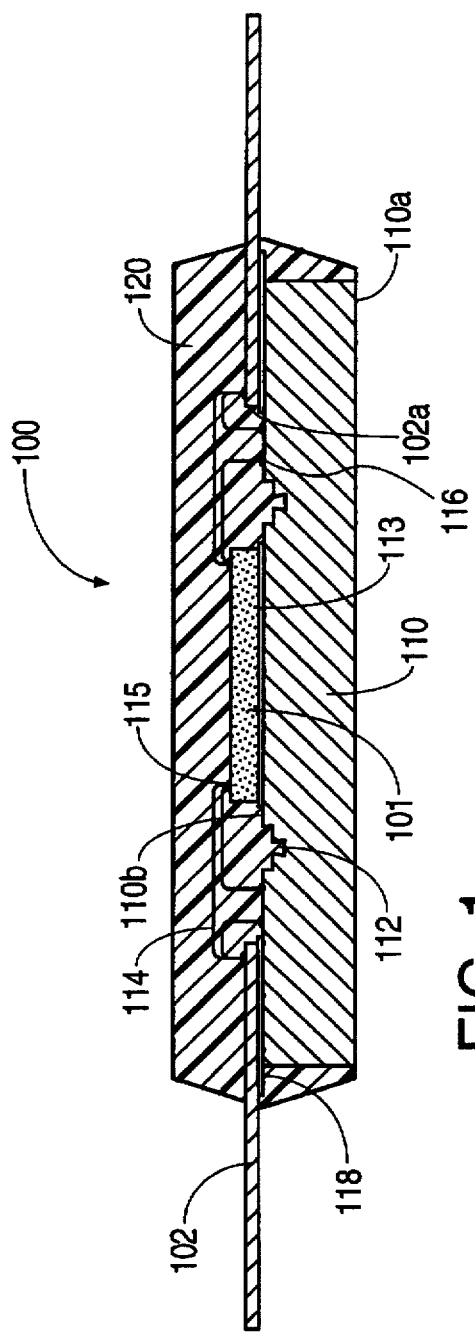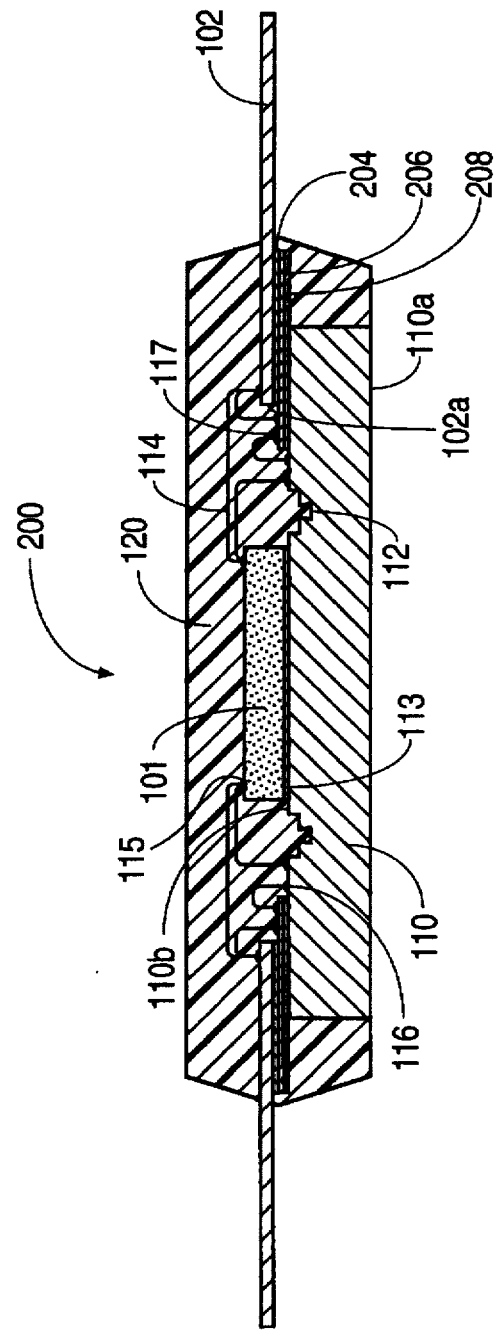
FIG. 1
FIG. 2A

PACKAGED SEMICONDUCTOR DIE INCLUDING HEAT SINK WITH LOCKING FEATURE

BACKGROUND OF THE INVENTION

1. Field of the Invention

This invention relates to packaging a semiconductor die or dice and, in particular, to packaged semiconductor die or dice including a heat sink. Most particularly, the invention relates to providing, in a surface mount packaged semiconductor die including a heat sink, a means for interlocking an encapsulant to the heat sink to prevent separation of the encapsulant from the heat sink, thus improving reliability of the packaged semiconductor die.

2. Related Art

Increased semiconductor production volumes have led to the development of more cost effective integrated circuit packaging, e.g., plastic encapsulant. However, conventional integrated circuit plastic encapsulant has poor thermal conductivity, making it disadvantageous for use with modern integrated circuits which are subject to greater heat buildup than their predecessors due to increased speed of operation and/or to increased density of electrical circuitry on the integrated circuit chip (a semiconductor die on which electrically conductive circuitry and bond pads are formed). In order to provide improved thermal performance (i.e., improved dissipation of heat), some plastic packaged integrated circuits now include a metallic heat sink to aid in the removal of heat from the integrated circuit chip to the exterior of the plastic encapsulant.

A problem has been encountered with surface mount plastic packaged integrated circuits including a heat sink. In surface mount plastic packaged integrated circuits, ends of electrically conductive package leads extend from the packaged integrated circuit. These ends are attached (by, for instance, soldering) to electrically conductive material on a mounting board (e.g., printed circuit board) to form electrical connection between the integrated circuit chip within the plastic package and other electronic components external to the package. During soldering of the package leads to the electrically conductive material formed on the mounting board, the entire packaged integrated circuit is heated to approximately 220°–240° C. During this heating, moisture that has previously been absorbed within the packaged integrated circuit rapidly becomes steam, expanding and exerting an outward force tending to separate the encapsulant from other elements (including the heat sink) of the packaged integrated circuit. This separation is known as "delamination." Also, subsequent heating and cooling of the packaged integrated circuit, e.g., after the packaged integrated circuit has been placed in operation, causes metallic elements within the packaged integrated circuit to expand and contract, giving rise to stresses that can increase the amount of delamination or produce delamination where it was not previously present.

Delamination can cause several problems. For instance, in some surface mount packaged integrated circuits, electrically conductive bond wires form "down" bonds between the heat sink and other bonding locations within the packaged integrated circuit (e.g., bond pads on the integrated circuit chip). In a typical surface mount packaged integrated circuit, the bond wires used to form down bonds are approximately 1 to 1.3 mils in diameter. This is sufficiently thin so that down bonds in typical surface mount packaged integrated circuits are susceptible to breaking as a result of stresses that arise if delamination of the encapsulant occurs (the delamination allowing movement of, for instance, the heat sink relative to other elements of the packaged integrated circuit). Delamination can also make it easier for moisture and contaminants to migrate from outside of the packaged integrated circuit to the integrated circuit chip inside the encapsulant, possibly causing failure of the chip.

In prior art packaged transistors including a heat sink, a moisture moat, i.e., a groove having a rectangular or "V" cross-sectional shape, has been cut into a surface of the heat sink in order to reduce moisture penetration. However, these moisture moats have reduced moisture ingress into the packaged transistor not by providing improved locking of the encapsulant to the heat sink (i.e., by minimizing delamination) so that moisture is sealed out of the packaged transistor, but, rather, by increasing the length of the interface between the heat sink and encapsulant so that moisture must travel a greater distance to reach the transistor inside the encapsulant.

This approach was adequate for older packaged transistors because delamination was not a significant concern for several reasons. First, the large size of the bond wires (typically approximately 10 mils in diameter as compared to the approximately 1 mil diameter bond wires typically used in current packaged integrated circuits) used in older packaged transistors rendered the bond wires insensitive to delamination of the encapsulant. Illustratively, since the strength of a bond is proportional to the square of the diameter of the bond wire, for the above illustrative bond wire diameters, bonds in the older packaged transistors are approximately 100 times stronger than bonds in current packaged integrated circuits. Second, most older packaged transistors were through-hole mounted to a mounting board, e.g., printed circuit board, so that during attachment of the packaged transistor to the mounting board, heat was applied on a side of the mounting board opposite that on which the packaged transistor was located. Thus, the mounting board protected the packaged transistor from direct exposure to the full amount of applied heat so that little of the moisture within the packaged transistor was heated to become steam, thus reducing the internal stresses that produce delamination.

Consequently, there is a need for a packaged semiconductor die or dice including a heat sink, having strong interlocking between the encapsulant and the heat sink so that delamination of the encapsulant is minimized or eliminated.

SUMMARY OF THE INVENTION

According to the invention, in a packaged semiconductor die or dice including a heat sink, delamination of the heat sink from an encapsulant is minimized. A locking feature (which can be, for example, a locking moat or moats, or a locking region) is formed in the heat sink such that the encapsulant interlocks with the heat sink through the locking feature. The invention applies broadly to packaged integrated circuits including multichip modules and hybrid circuits.

In one embodiment of the invention, a structure includes a semiconductor die on which electrically conductive traces and a plurality of electrically conductive bond pads are formed, a plurality of electrically conductive package leads, a plurality of electrically conductive bond wires, a heat sink having a locking moat formed in a locking surface of the heat sink, and encapsulant encapsulating the die, bond wires, heat sink and an inner portion of the package leads. The surface of the semiconductor die opposite the surface on which the traces and bond pads are formed is attached to a first surface of the heat sink (which may be recessed or elevated with respect to, or coincident with, the locking surface of the heat sink). An inner end of each of the package leads is disposed in proximity to the die. Each of selected ones of the bond pads on the die are electrically connected with a bond wire to the inner end of a corresponding package lead. The locking moat is formed between the die and the inner ends of the package leads, and has a cross-sectional shape that interlocks with the encapsulant to prevent the encapsulant from separating from the heat sink.

The structure can include more than one locking moat. The locking moat or moats can be formed in the heat sink to surround the periphery of the semiconductor die. The dimensions of the locking moat or moats must be chosen so that adequate space is left on the first surface of the heat sink and/or the locking surface of the heat sink to allow formation of bonds on the heat sink.

Generally, a locking moat according to the invention has any shape which provides good locking of the encapsulant to the heat sink. In one embodiment, the locking moat has a cross-sectional shape, in a plane perpendicular to the locking surface, that has, at a first distance from the locking surface, a width that is larger than the width at a second distance from the locking surface, the second distance being smaller than the first distance. This difference in widths locks the encapsulant in place if the encapsulant begins to move away from the heat sink, because at some point beneath the second distance the encapsulant is too wide to pass through the width at the second distance. In other embodiments of the invention, the locking moat has a "keyhole" cross-sectional shape or a circular cross-sectional shape.

Because the locking moat according to the invention minimizes or eliminates delamination of the encapsulant from the heat sink, breaking or weakening of down bonds formed on the heat sink is minimized when the packaged semiconductor die is subjected to heat during attachment to a mounting board, or as the packaged semiconductor die experiences thermal expansion and contraction during long term use. Further, down bonds are preferably formed on the locking surface of the heat sink such that the locking moat is between the down bonds and the area in which the die is attached, so that propagation of delamination stresses from the die attach area to the down bonds is prevented. Additionally, the locking moat helps minimize migration of moisture and contaminants to the die from outside the encapsulant.

The locking moat according to the invention can be formed by, for instance, stamping or chemical etching. In one embodiment of the invention, a locking moat having a "keyhole" cross-sectional shape is made by a two step coining operation. A first coining tool forms a channel in the heat sink to a desired depth. Then, a second coining tool forms a wider channel to a second depth that is less than the first depth. The second coining tool deforms the heat sink material to fill in part of the lower portion of the first channel so that a "keyhole" cross-sectional shape is formed.

Rather than a locking moat, the locking feature can be a locking region. In one embodiment, dimples are formed in the locking surface of the heat sink, by, for instance, stamping, grinding, mechanical or laser drilling, or chemical etching. The dimples can be formed in any desired pattern. In another embodiment, a locking region is formed by abrading an area of the locking surface to form a rough surface by, for example, sandblasting. Alternatively, such a roughened surface can be formed by selective electroplating with appropriate control of the current density, plating time and plating bath additives. In another embodiment, a patterned locking region is formed by coining an area of the locking surface with a patterned coining tool.

Packaged semiconductor die or dice including a heat sink with a locking feature according to the invention can be made so that a surface of the heat sink is exposed to the exterior of the encapsulant. Further, the packaged semiconductor die or dice can include one or more generally conductive layers that can be used to provide a ground plane or planes, power plane or planes, or signal routing. If more than one generally conductive layer is included, generally conductive layers can be formed on opposite sides or the same side of the package leads.

BRIEF DESCRIPTION OF THE DRAWINGS

FIG. 1 is a cross-sectional view of a packaged integrated circuit including a heat sink with a locking moat according to an embodiment of the invention.

FIG. 2A is a cross-sectional view of a packaged integrated circuit including a heat sink with a locking moat according to another embodiment of the invention.

DETAILED DESCRIPTION OF EMBODIMENTS OF THE INVENTION

Figure 2B:
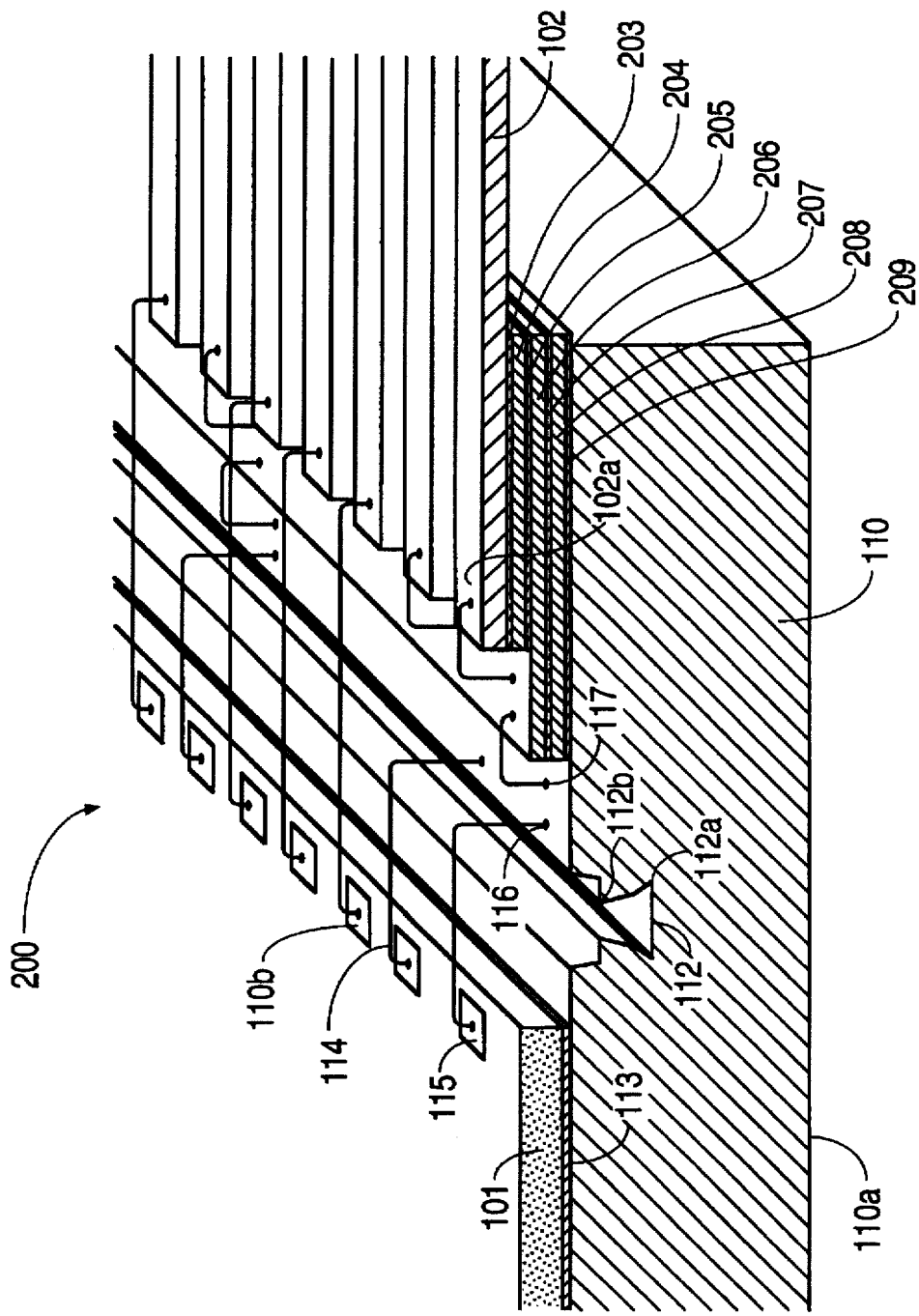
FIG. 2B is a perspective view of a portion of the packaged integrated circuit of FIG. 2A without the encapsulant.

According to the invention, a heat sink is included with a packaged semiconductor die or dice, a locking feature (which can be, for example, a locking moat or moats, or a locking region) being formed in the heat sink so that delamination of the encapsulant from the heat sink is minimized or eliminated. The locking feature is formed in the heat sink such that the encapsulant interlocks with the heat sink through the locking feature. The invention applies broadly to packaged integrated circuits including multichip modules and hybrid circuits, and is particularly useful for surface mount packaged integrated circuits including a heat sink.

FIG. 1 is a cross-sectional view of packaged integrated circuit 100 including heat sink 110 with locking moat 112 according to an embodiment of the invention. Semiconductor die 101, on a surface of which electrically conductive bond pads 115 and circuitry (not shown) are formed (integrated circuit chip), is attached to surface 110b (heat sink die attach surface) of heat sink 110 with adhesive 113. (Herein, formation of circuitry and bond pads "on" a surface of a semiconductor die is also intended to encompass formation of circuitry and bond pads "in" a surface of a semiconductor die.) Adhesive 113 can be, for example, solder, glass, epoxy resin or polyimide. Heat sink 110 is made of, for instance, pure copper or a copper-tungsten alloy. Package leads 102 are attached to heat sink 110 with adhesive 118 so that lead tip 102a of each package lead 102 is proximal to die 101. Package leads 102 may be formed on one or more sides of die 101. Adhesive 118 is electrically insulative and can be, for instance, epoxy resin or polyimide. Conventional wirebonding equipment and processes are used to extend bond wires 114 between bond pads 115 on die 101 and bonding locations 116 on heat sink 110, between bond pads 115 and lead tips 102a of package leads 102, and between bonding locations 116 and lead tips 102a of package leads 102 to make desired electrical interconnections between the circuitry on die 101, heat sink 110 and package leads 102. Die 101, heat sink 110, bond wires 114, and an inner portion of package leads 102 are encapsulated by, for instance, molding, in encapsulant 120 which can be, for example, plastic. Surface 110a of heat sink 110 is exposed to the exterior of encapsulant 120, though this need not necessarily be the case. Encapsulant 120 fills in locking moat 112. As explained in more detail below, because of the shape of locking moat 112, encapsulant 120 is interlocked with heat sink 110.

FIG. 2A is a cross-sectional view of packaged integrated circuit 200 including heat sink 110 with locking moat 112 according to another embodiment of the invention. Similarly to packaged integrated circuit 100 of FIG. 1, semiconductor die 101 is attached to surface 110b of heat sink 110 with adhesive 113. Generally conductive layer 206 is sandwiched between dielectric layers 204 and 208. Generally conductive layer 206 and dielectric layers 204 and 208 are formed around the periphery of die 101. Dielectric layer 208 is attached to heat sink 110, as explained below with respect to FIG. 2B. Package leads 102 are attached to dielectric layer 204, as also explained below with respect to FIG. 2B, so that lead tip 102a of each package lead 102 is proximal to die 101. As with packaged integrated circuit 100 of FIG. 1, package leads 102 may be formed on one or more sides of die 101. Bond wires 114 are used to make electrical connection between bond pads 115 formed on die 101, bonding locations 116 on heat sink 110, bonding locations 117 on generally conductive layer 206, and package leads 102. Die 101, heat sink 110, generally conductive layer 206, dielectric layers 204, 208, bond wires 114, and an inner portion of package leads 102 are encapsulated in encapsulant 120. Surface 110a of heat sink 110 is exposed to the exterior of encapsulant 120. Encapsulant 120 interlocks with heat sink 110 through locking moat 112.

FIG. 2B is a perspective view of a portion of packaged integrated circuit 200 without encapsulant 120. Adhesives 203, 205, 207 and 209 are used to attach dielectric layer 204 to package leads 102, generally conductive layer 206 to dielectric layer 204, dielectric layer 208 to generally conductive layer 206, and heat sink 110 to dielectric layer 208, respectively.

Generally conductive layer 206 can be used to provide a ground plane or planes, power plane or planes, or signal routing. More than one generally conductive layer can be included, and generally conductive layers can be formed between package leads 102 and heat sink 110, or on the opposite side of package leads 102. The formation and use of a generally conductive layer such as generally conductive layer 206 is described in more detail in commonly owned, co-pending U.S. Patent Application entitled "Integrated Circuit with Heat Sink having Improved In-Package Power and Ground Planes and Signal Routing," by Robert C. Marrs, filed on the same date as the present application, attorney docket no. M-2118, the pertinent disclosure of which is herein incorporated by reference. It is to be understood that generally conductive layer 206 and dielectric layers 204 and 208 need not be present in a packaged integrated circuit according to the invention.

In FIGS. 1, 2A and 2B (and in the embodiments of the invention described below), a locking feature (e.g., locking moat 112) is formed in the same surface of the heat sink as that on which the semiconductor die is mounted. However, the invention encompasses packaged semiconductor die in which the die is mounted on a surface (die attach surface) that is elevated or recessed with respect to the surface (locking surface) in which the locking feature is formed.

Generally, locking moat 112 according to the invention has any shape which provides good locking of encapsulant 120 to heat sink 110. In one embodiment of a packaged semiconductor die according to the invention, a locking moat is formed in a heat sink and has a cross-sectional shape, in a plane perpendicular to the heat sink locking surface, that has, at a first distance from the heat sink locking surface, a width that is larger than the width at a second distance from the heat sink locking surface, the second distance being smaller than the first distance. This difference in widths locks the encapsulant in place if the encapsulant begins to move away from the heat sink, because at some point beneath the second distance the encapsulant is too wide to pass through the width at the second distance.

In FIGS. 1, 2A and 2B, locking moat 112 has a "keyhole" cross-sectional shape. If encapsulant 120 begins to move away from heat sink 110, the wide section of encapsulant 120 at bottom 112a (FIG. 2B) of locking moat 112 cannot move past narrow mid-section 112b of locking moat 112.

In one embodiment of the invention, locking moat 112 is formed so that locking moat 112 surrounds the entire periphery of die 101. It is to be understood that locking moat 112 can be formed on any number of sides of die 101 and can have any length on each side.

Further, though the exact dimensions of locking moat 112 are not critical to the invention, the dimensions are chosen so that encapsulant 120 interlocks adequately with heat sink 110, and so that adequate space is left on surface 110b of heat sink 110 between die 101 and lead tips 102a of package leads 102 to allow formation of bonds on heat sink 110.

As discussed above, down bonds are formed between bonding locations 116 on heat sink 110 and other bonding locations within the packaged integrated circuit, e.g., bond pads 115 on die 101, bonding locations 117 on generally conductive layer 206, or package leads 102. When packaged integrated circuit 100 or 200 is subjected to heat during attachment to a mounting board, or as packaged integrated circuit 100 or 200 experiences thermal expansion and contraction during long term use, the expansion of accumulated moisture creates stresses which act to cause delamination of encapsulant 120 and, consequently, breaking of down bonds. Because locking moat 112 minimizes delamination of encapsulant 120, breaking of down bonds is minimized.

Bonding locations 116 are preferably formed on surface 110b of heat sink 110 such that locking moat 112 is between bonding locations 116 and the area of surface 110b to which die 101 is attached. Moisture particularly accumulates in adhesive 113 used to attach die 101 to heat sink 110. During heating of packaged integrated circuits 100 or 200, this moisture becomes steam which rapidly expands and makes the die/heat sink/encapsulant interface a region of high delamination stress. Additionally, since die 101, heat sink 110 and encapsulant 120 are each made of different materials having different coefficients of thermal expansion, the die/heat sink/encapsulant interface is also a region of high delamination stress because of the different amounts of thermal expansion that occur in those materials during heating of packaged integrated circuits 100 or 200. The delamination stresses propagate along surface 110b of heat sink 110, causing encapsulant 120 to separate or "peel away" from surface 110b. Locking moat 112 stops this "peeling" before it reaches bonding locations 116 on heat sink 110, preventing the "peeling" encapsulant 120 from pulling the bonds at bonding locations 116 loose.

In addition to minimizing delamination, locking moat 112 helps minimize migration of moisture and contaminants to die 101 from outside encapsulant 120. This occurs both because locking moat 112 minimizes delamination of encapsulant 120 and because the presence of locking moat 112 increases the length of the path that moisture and contaminants must travel to reach die 101.

Figure 3A:
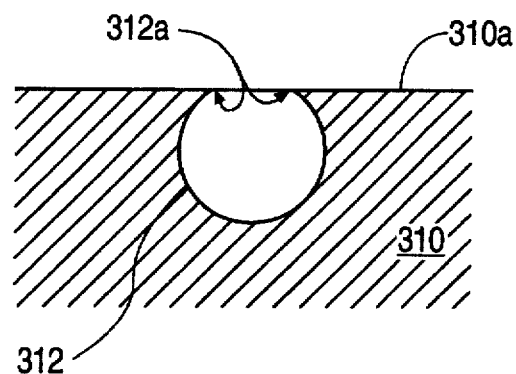
FIG. 3A is a cross-sectional view of a portion of a heat sink including a locking moat according to another embodiment of the invention.

FIG. 3A is a cross-sectional view of heat sink 310 including locking moat 312 formed in surface 310a (heat sink locking surface) according to another embodiment of the invention. Locking moat 312 conforms to the above description in that locking moat 312 is wider at a first distance from surface 310a than at a second distance from surface 310a that is less than the first distance. In FIG. 3A, locking moat 312 has a "circular" shape. Locking moat 312 can be formed by, for instance, etching. Locking moat 312 is "overetched," according to techniques that are well known to those skilled in the art of etching, to produce overhanging ledges 312a.

Figure 3B:
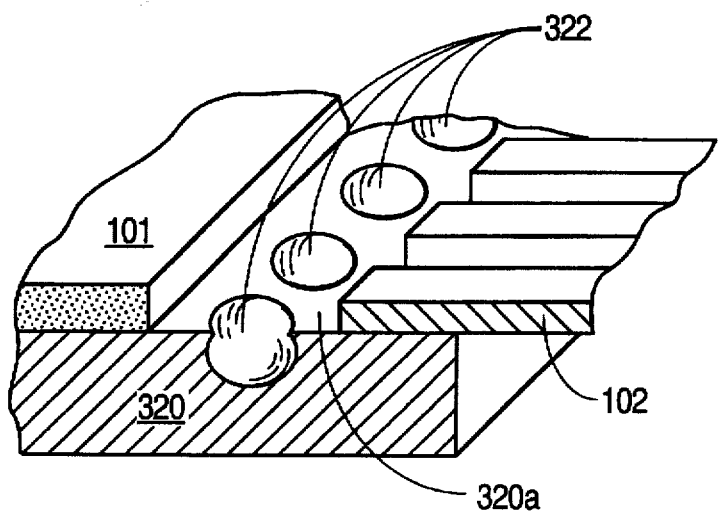
FIGS. 3B through 3F are perspective views of a portion of a semiconductor die, package leads, and a heat sink including a locking feature according to additional embodiments of the invention.

FIGS. 3B through 3F are perspective views of a portion of a semiconductor die, package leads and a heat sink including a locking feature according to additional embodiments of the invention. In FIG. 3B, a row of dimples 322 are formed in surface 320a of heat sink 320. Similar to the width of locking moats of embodiments of the invention described above, dimples 322 each have a diameter at a first distance from surface 320a that is larger than a diameter at second distance from surface 320a, the second distance being less than the first distance. Thus, encapsulant that is formed to enclose die 101, heat sink 320 and an inner portion of package leads 102, as explained in more detail below, fills in dimples 322 so that the encapsulant is prevented from moving away from surface 320a of heat sink 320, thus decreasing the possibility of delamination. Dimples 322 can be formed by mechanical stamping, drilling or grinding, laser drilling, or chemical etching ("overetching," as described above).

Figure 3C:
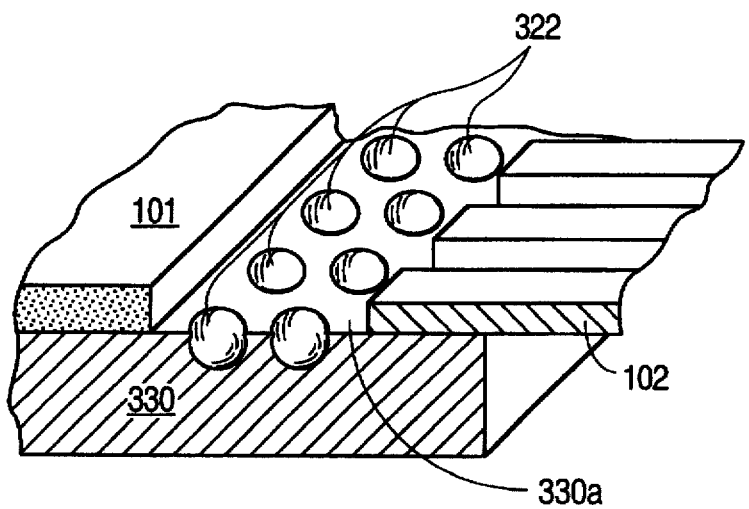

In FIG. 3C, dimples 332 are formed in surface 330a of heat sink 330 in two rows. The shape of dimples 332 is similar to that of dimples 322 (FIG. 3B), and dimples 332 can be formed as described above for dimples 322. Dimples 332 prevent encapsulant delamination in the same manner as dimples 322 of FIG. 3B. Generally, according to the invention, dimples can be formed on a heat sink locking surface in any number of rows, or in any desired configuration (e.g., staggered rows, irregular patterns).

Though dimples 322 (FIG. 3B) and dimples 332 (FIG. 3C) are shown as having a circular cross-sectional shape in each plane that is parallel to surface 320a or 330a, respectively, this need not be the case. For instance, dimples 322 and 332 could have an oval, an elongated "racetrack," a rectangular, or other cross-sectional shape.

Figure 3D:
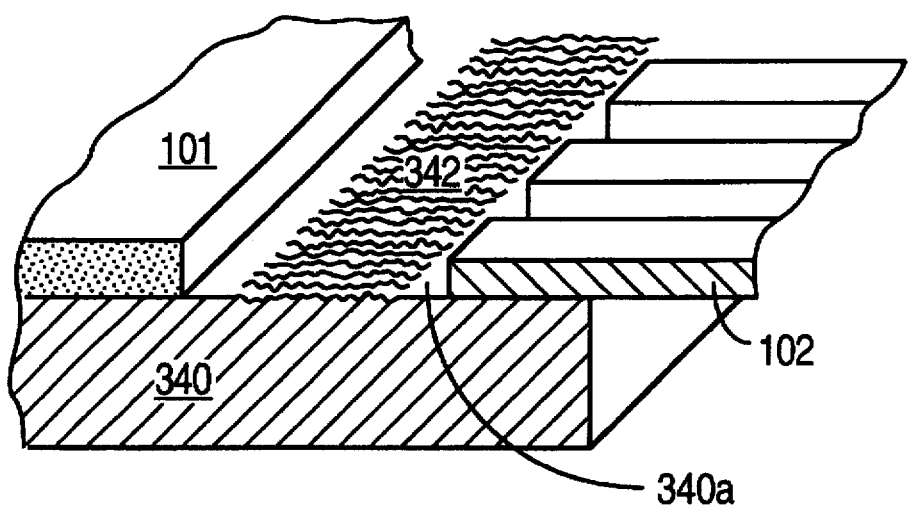

In FIG. 3D, locking region 342 is formed in surface 340a of heat sink 340. Locking region 342 is a roughened area of surface 340a. Surface 340a is masked so that the area in which it is desired to form locking region 342 is left exposed. The exposed area is then abraded by, for example, sandblasting using well-known equipment and techniques to form locking region 342. In a packaged semiconductor die including heat sink 340, encapsulant fills in the nooks and crannies of roughened locking region 342, thus providing locking between the encapsulant and heat sink 340.

Other methods of forming locking region 342 can be used. For instance, selective electroplating can be used to form locking region 342. By adjusting the current density, plating time and plating bath additives, a roughly textured plated surface can be formed on surface 340a.

Figure 3E:
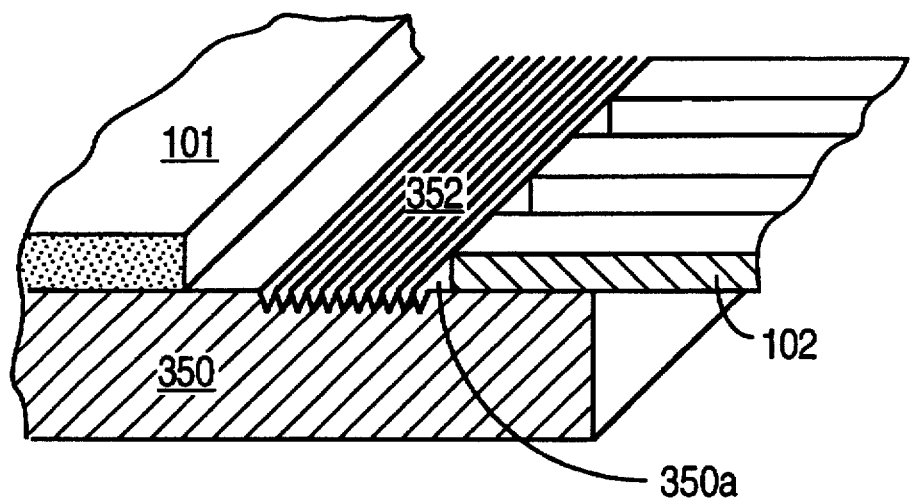

In FIG. 3E, a locking region 352 is formed in surface 350a of heat sink 350. Locking region 352 is a patterned region of surface 350a that is formed by coining. First, a surface of a coining tool is patterned in a desired manner by, for instance, electrochemical etching. The pattern is formed of adjacent elevated and depressed regions. The coining tool is then stamped onto surface 350a of heat sink 350 to form locking region 352. Locking region 352 is shown as a pattern of alternating rows of peaks and valleys; however, it is to be understood that other patterns can be used.

Figure 3F:
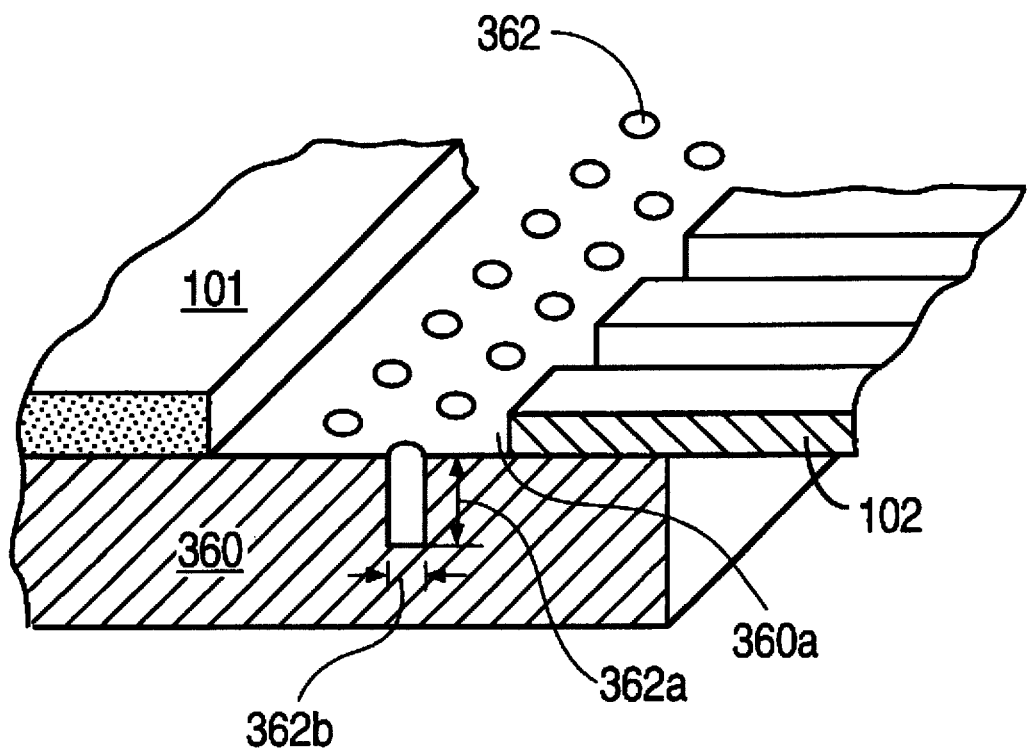

In FIG. 3F, holes 362 are formed in surface 360a of heat sink 360. Holes 362 can be formed by mechanical stamping, drilling or grinding, laser drilling, or chemical etching. Encapsulant that is formed to enclose die 101, heat sink 360 and an inner portion of package leads 102 fills in holes 362. Each of holes 362 has a depth 362a that is large relative to the diameter 362b. Consequently, encapsulant cannot easily withdraw from holes 362 because lateral movement that typically occurs when encapsulant moves in a direction perpendicular to surface 360a is restrained by the walls of holes 362, thus impeding the movement of encapsulant out holes 362. In one embodiment of the invention, holes 362 have a depth 362a to diameter 362b ratio of greater than or equal to 3:1. In one particular embodiment, holes 362 have a diameter 362b between 3 and 4 mils, and a depth 362a between 10 and 12 mils.

Though, in FIG. 3F, holes 362 are formed in two staggered rows, holes 362 can be formed in any number of rows and need not be staggered. In fact, holes 362 need not be formed in any regular pattern, but can be located randomly in surface 330a of heat sink 330. Further, though holes 362 are shown as having a circular cross-sectional shape in each plane that is parallel to surface 360a, this need not be the case. For instance, holes 362 could have an oval, an elongated "racetrack," a rectangular, or other cross-sectional shape.

Figure 4:
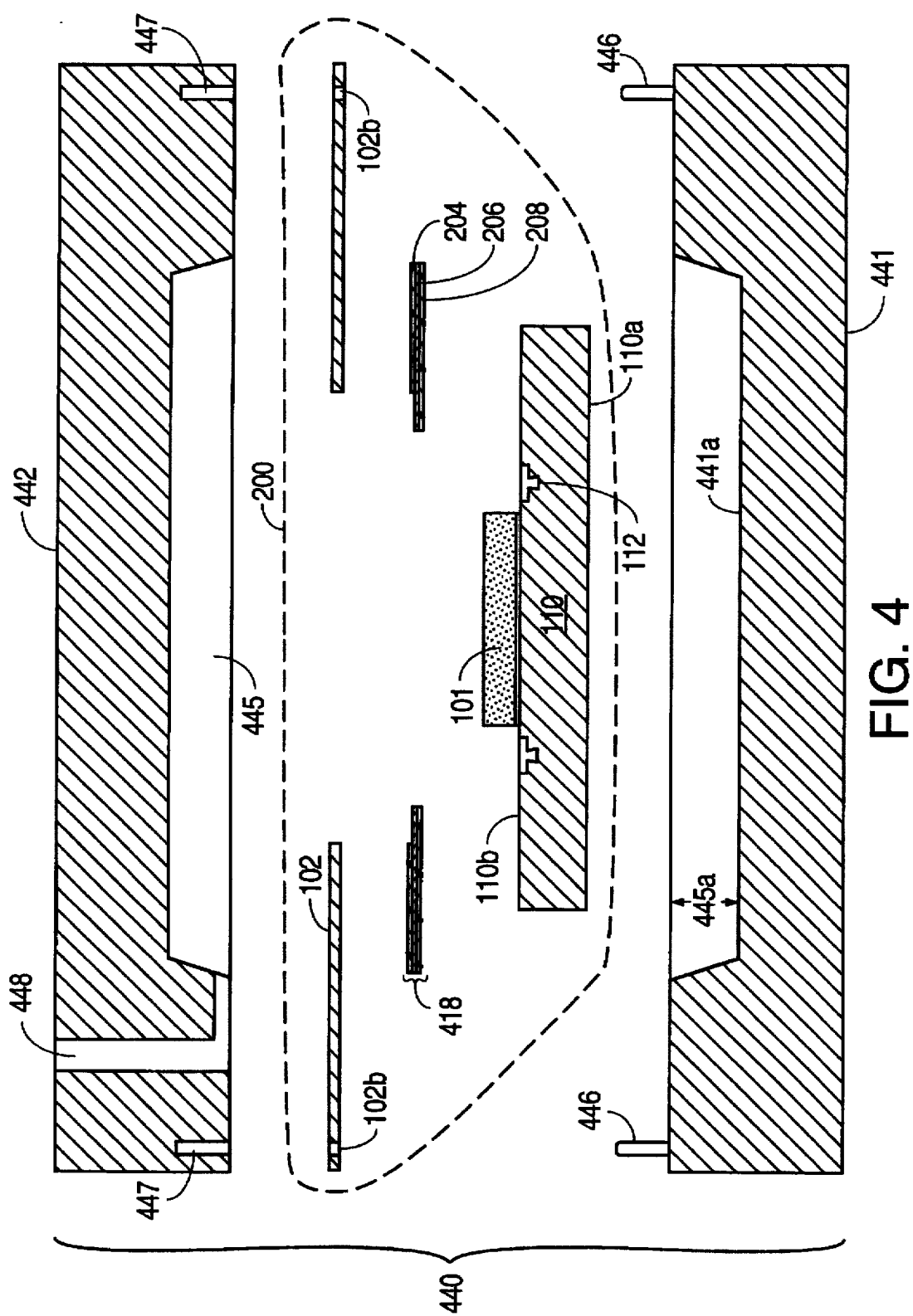
FIG. 4 is an exploded cross-sectional view of a partially packaged integrated circuit disposed in a mold cavity of a mold assembly that is used to produce the packaged integrated circuit of FIGS. 2A and 2B.

FIG. 4 is an exploded cross-sectional view of partially packaged integrated circuit 200 (FIGS. 2A and 2B) disposed in mold cavity 445 of mold assembly 440 that is used to produce packaged integrated circuit 200. Partially packaged integrated circuit 200 includes semiconductor die 101, heat sink 110, package leads 102 of a leadframe, and "sandwich" 418 which includes generally conductive layer 206 assembled between dielectric layers 204 and 208. Sandwich 418 is formed with a rectangular hole in its center so that in packaged integrated circuit 200, sandwich 418 surrounds the periphery of die 101.

Sandwich 418 may be formed in the following manner. Dielectric layers 204 and 208, made of, for instance, polyimide, are coated with adhesive, such as epoxy resin, by, for instance, screening or roll coating. Alternatively, as is commonly done, dielectric layers 204 and 208 can be purchased from a vendor with adhesive, such as epoxy adhesive, already applied to both sides of dielectric layers 204 and 208.

Generally conductive layer 206 is placed on dielectric layer 208 such that an adhesive-coated side of dielectric layer 208 faces generally conductive layer 206. While heat is applied, dielectric layer 208 and generally conductive layer 206 are squeezed together by, for instance, a mechanical press. The application of heat causes the adhesive to become tacky. Dielectric layer 208 and generally conductive layer 206 are allowed to cool to room temperature, solidifying the adhesive and bonding dielectric layer 208 to generally conductive layer 206.

In one embodiment, a desired pattern is etched and a hole is punched through dielectric layer 208 and generally conductive layer 206. In an alternative embodiment, the hole is stamped using a conventional punch. A larger hole is formed through dielectric layer 204. Dielectric layer 204 is aligned, then attached to generally conductive layer 206 in the manner described above for dielectric layer 208 and generally conductive layer 206.

Note that conductive regions and paths could be formed on, or etched from, generally conductive layer 206 either before the attachment of generally conductive layer 206 to dielectric layers 204 and 208 or after the attachment of dielectric layer 208. If after, the generally conductive traces and regions would, of course, be formed on, or etched from, the surface of generally conductive layer 206 not attached to dielectric layer 208.

Locking moat 112 can be formed in heat sink 110 by, for instance, coining, mechanical cutting or grinding, or laser cutting. FIGS. 5A through 5F are cross-sectional views of heat sink 110 illustrating a method for forming locking moat 112. In FIGS. 5A through 5F, locking moat 112 is formed by a two step coining operation.

Figure 5A:
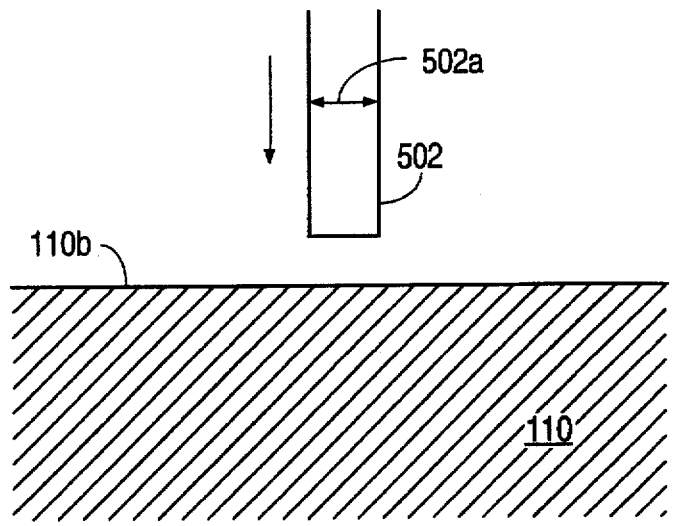
FIGS. 5A through 5F are cross-sectional views of a heat sink illustrating a method for forming a locking moat in the heat sink according to one embodiment of the invention.
Figure 5B:
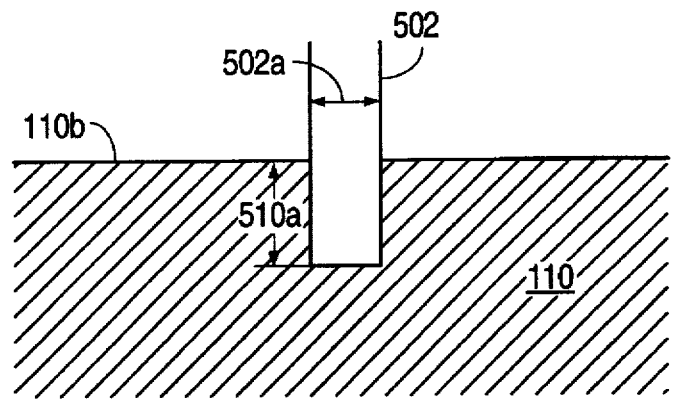
Figure 5C:
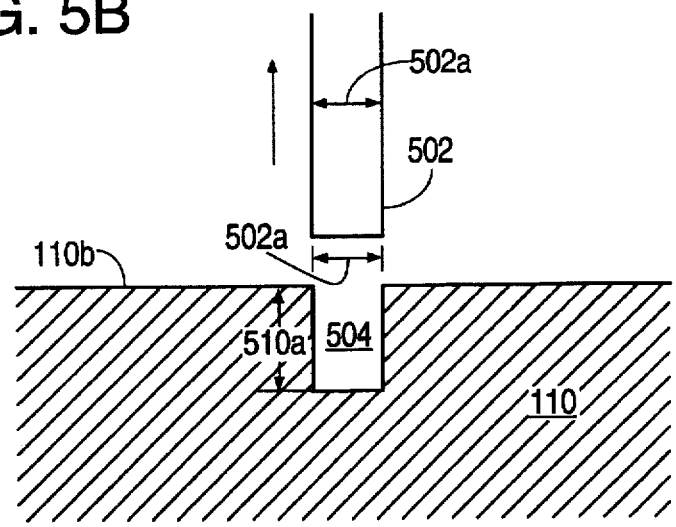

In FIG. 5A, conventional first punching tool 502, having a width 502a and a length (measured perpendicular to the plane of FIG. 5A) of a desired magnitude, is positioned over surface 110b. First punching tool 502 moves downward, cutting into heat sink 110 to a depth 510a, as shown in FIG. 5B. First punching tool 502 is then withdrawn, as shown in FIG. 5C, leaving first channel 504 in heat sink 110 of width 502a, depth 510a and a desired length (perpendicular to the plane of FIGS. 5A through 5F).

Figure 5D:
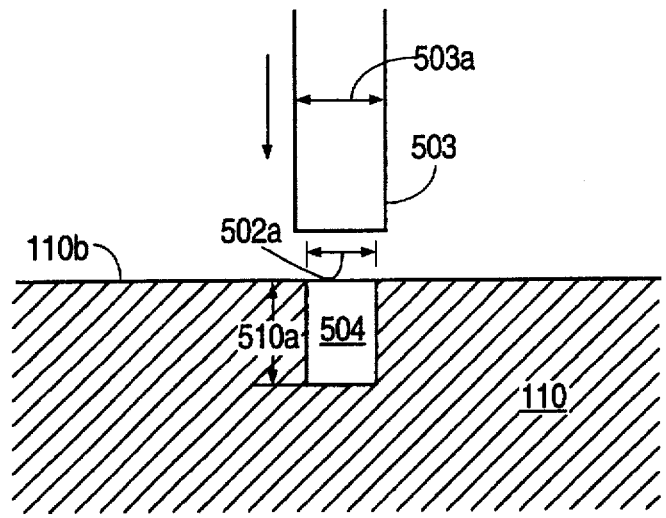
Figure 5E:
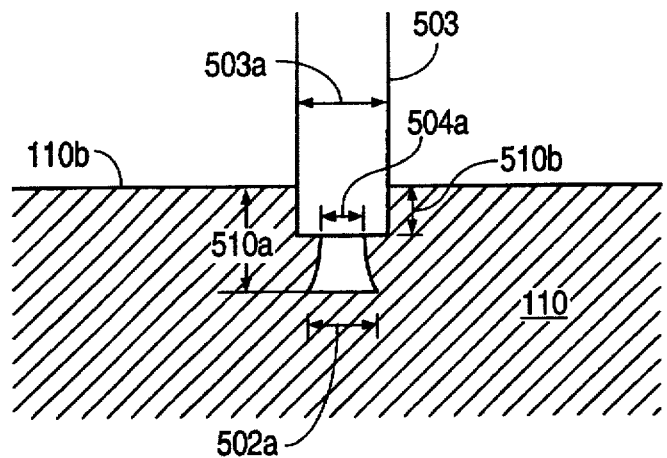
Figure 5F:
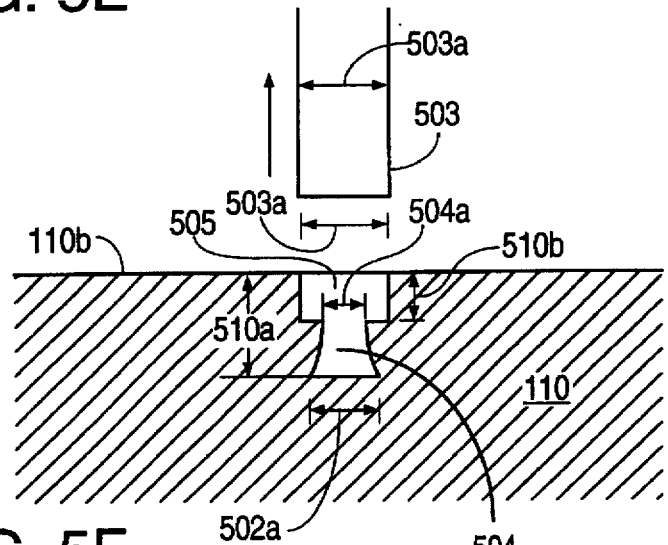

In FIG. 5D, second conventional punching tool 503, having a width 503a that is slightly larger than width 502a of first punching tool 502, is positioned over first channel 504. Second punching tool 503 moves downward, cutting into heat sink 110 to a depth 510b, as shown in FIG. 5E. Second punching tool 503 forces the material adjacent first channel 504 down into first channel 504 in the manner shown in FIG. 5E. Second punching tool 503 is then withdrawn, as shown in FIG. 5F, leaving a second channel 505 in heat sink 110 of width 503a and depth 510b that is at least partly coincident with first channel 504. Because the material was forced down into first channel 504 by second punching tool 503 as explained above, the width of first channel 504 decreases from width 502a at the bottom of first channel 504 to width 504a at depth 510b.

Figure 6A:
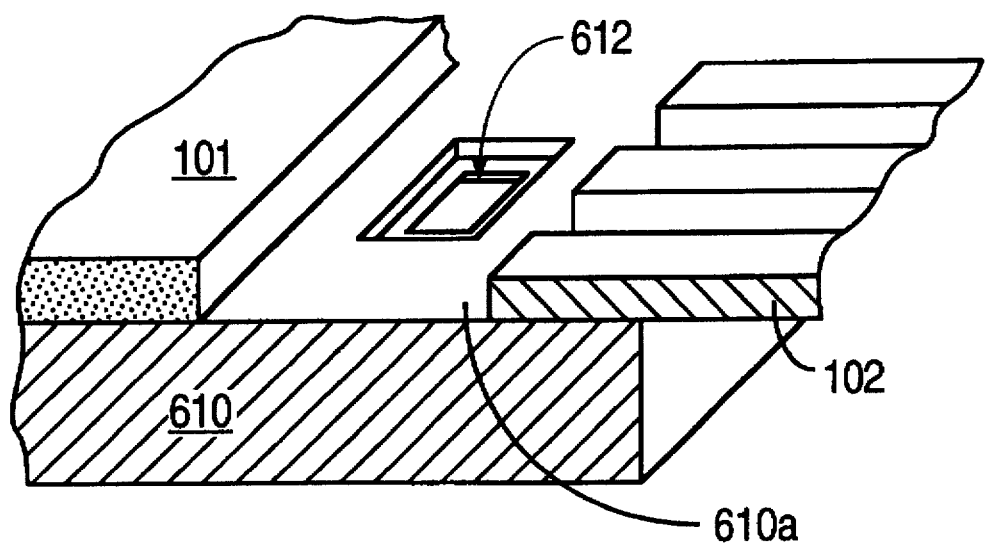
FIGS. 6A and 6B are perspective views of a portion of a semiconductor die, package leads, and a heat sink including a locking feature according to additional embodiments of the invention.
Figure 6B:
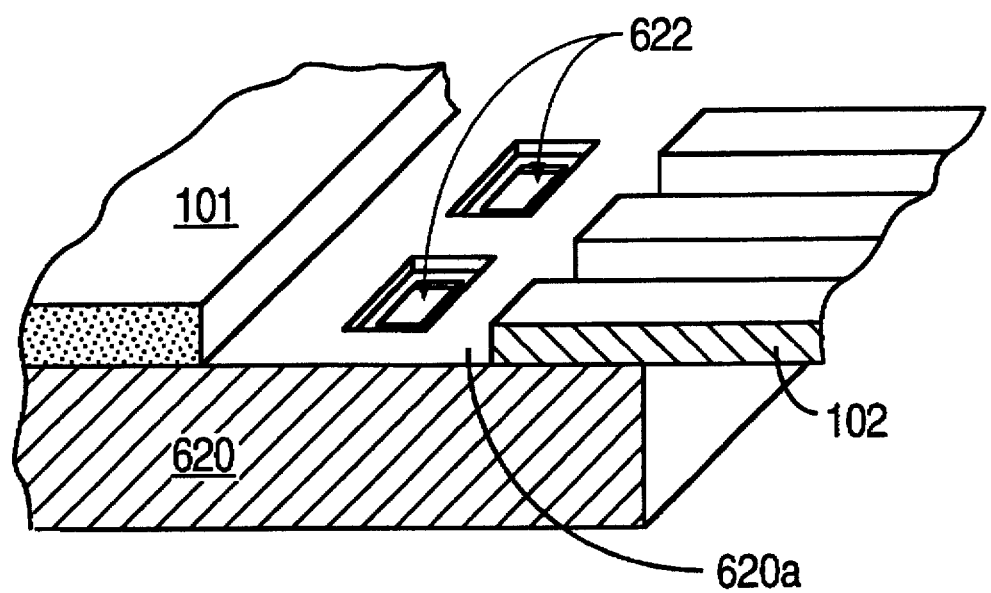

Channel 504 may alternatively, depending upon the length of first punching tool 502, be a hole. FIG. 6A is a perspective view of a portion of a semiconductor die 101, package leads 102, and heat sink 610 including a locking hole 612 according to an embodiment of the invention. FIG. 6B is a perspective view of a portion of a semiconductor die 101, package leads 102, and heat sink 620 including locking holes 622 according to another embodiment of the invention. Locking hole 612 and locking holes 622 are formed in surface 610a of heat sink 610 and surface 620a of heat sink 620, respectively, in a manner similar to that described above with respect to FIGS. 5A through 5F. The length of each of the punching tools 502 and 503 is decreased in order to form locking hole 612 or locking holes 622. Locking holes 622 can be formed one at a time or simultaneously.

Returning to FIG. 4, dielectric layer 208 of sandwich 418 is attached to heat sink 110, package leads 102 of the leadframe are attached to dielectric layer 204 of sandwich 418, and semiconductor die 101 is attached to heat sink 110 with adhesives. (It is to be understood that, in embodiments of the invention in which generally conductive layer 206 and dielectric layers 204 and 208 are not present, package leads 102 are attached directly to the surface 110b of heat sink 110.) The adhesives bond heat sink 110, sandwich 418, die 101 and the leadframe by being heated to become tacky, then cooled to solidify. Each of the attachments—sandwich 418 to heat sink 110, package leads 102 to sandwich 418, die 101 to heat sink 110—could be performed simultaneously or sequentially (one at a time or two at a time) in a desired order. In one embodiment of the invention, sandwich 418 is attached to package leads 102 and heat sink 110, then die 101 is attached to heat sink 110.

Selected package leads 102 are bonded, using conventional wirebonding techniques, to bond pads on die 101, or to bonding locations formed on generally conductive layer 206 or heat sink 110. Likewise, selected bond pads on die 101 are bonded to package leads 102, or to bonding locations formed on generally conductive layer 206 or heat sink 110.

Partially packaged integrated circuit 200 is positioned within mold cavity 445 of mold assembly 440. Package leads 102 extend inwardly from the rectangular frame of the leadframe. Holes 102b are formed through the frame at intervals. Pins 446 are formed in mold half 441 of mold assembly 440. Pins 446 fit through holes 102b, extending into corresponding recesses 447 and holding the leadframe in place in mold cavity 445.

After partially packaged integrated circuit 200 is mounted in mold cavity 445, mold halves 441 and 442 are brought together. Just prior to closure of mold assembly 440, surface 441a of mold half 441 contacts surface 110a of heat sink 110. The combined thickness of heat sink 110, dielectric layers 204 and 208, and generally conductive layer 206 is intentionally made slightly greater than dimension 445a of mold half 441. As a result, the closing motion of mold half 441 forces the combination of heat sink 110, dielectric layers 204 and 208, and generally conductive layer 206 upward during mold closure. Since package leads 102 are held in place by pins 446, this upward motion causes the inner portions of package leads 102 to bend upward. This bending of package leads 102 gives rise to tensile forces in package leads 102 that act to counteract the movement of heat sink 110, dielectric layers 204 and 208, and generally conductive layer 206, forcing surface 110a of heat sink 110 against mold surface 441a.

When mold assembly 440 is fully closed, an encapsulant such as plastic, is pressure fed by, for instance, transfer molding or injection molding, into mold cavity 445 until mold cavity 445 is full. The encapsulant is fed into mold cavity 445 through channel 448 in a method known as top side gating. Other gating methods could be used for transferring encapsulant into mold cavity 445, e.g., gang pot, top plane gating, bottom plane gating. After mold cavity 445 is filled with encapsulant, the encapsulant is allowed to solidify (time-temperature cured). Mold assembly 440 is then opened and packaged integrated circuit 200 removed.

Since, as explained above, a good seal is maintained between heat sink surface 110a and mold cavity surface 441a during the encapsulation process, encapsulant bleed (the undesirable presence of translucent encapsulant) or encapsulant flash (the undesirable presence of encapsulant greater in thickness than bleed and visible to the naked eye) are minimized. Thus, heat sink surface 110a remains exposed to the exterior of packaged integrated circuit 200. Any minor amounts of encapsulant bleed or flash that does form on heat sink surface 110a can be removed using conventional cleaning techniques. The above-described method for encapsulating an integrated circuit with heat sink such that a surface of the heat sink remains exposed outside the encapsulant is described in detail in commonly owned, co-pending U.S. patent application Ser. No. 07/822,297, entitled "Plastic Molded Package with Heat Sink for Integrated Circuit Devices," by Robert C. Marrs, filed Jan. 17, 1992, and U.S. patent application Ser. No. 07/973,354, entitled "Method for Forming Plastic Molded Package with Heat Sink for Integrated Circuit Devices," by Robert C. Marrs, filed Nov. 9, 1992, the pertinent disclosure of which is herein incorporated by reference.

After removal of packaged integrated circuit 200 from mold assembly 440, outer portions of package leads 102 extend outside the encapsulant and are connected to each other by the frame of the leadframe. Package leads 102 are physically separated by removing the portions of the frame between package leads 102. Individual package leads 102 may be then be bent, if desired, into a position that allows surface mounting of packaged integrated circuit 200.

Figure 7:
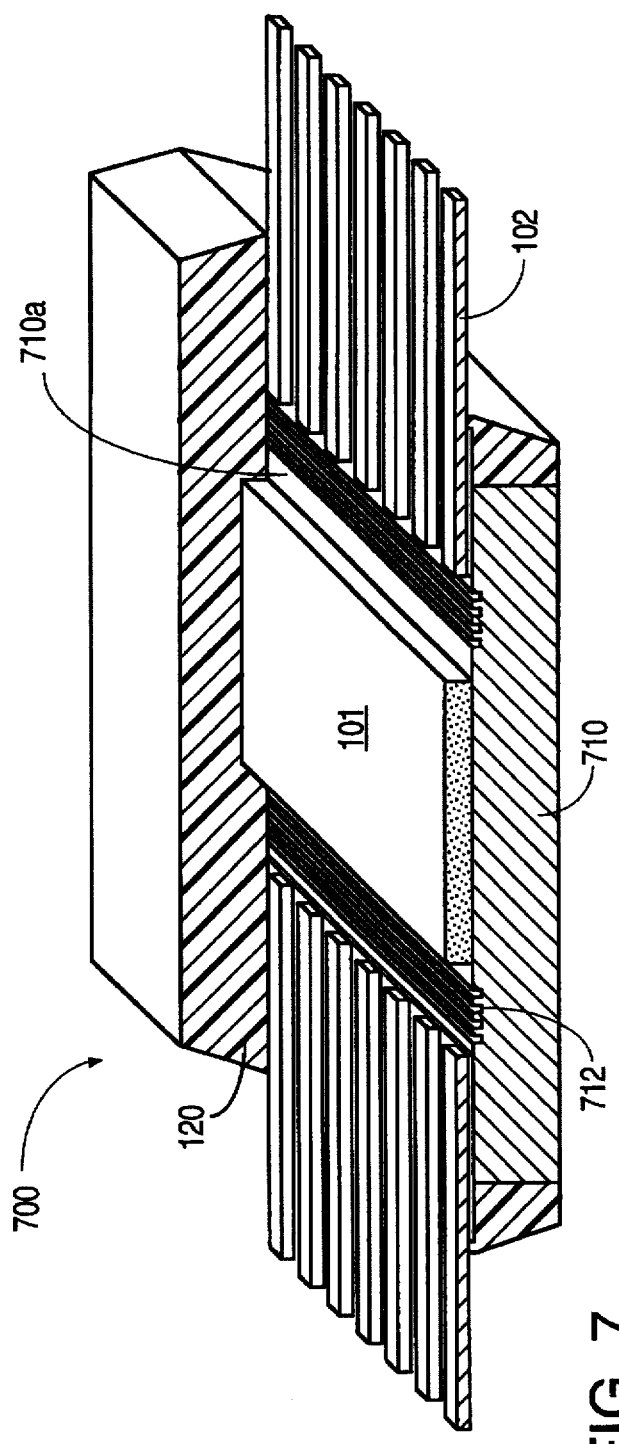
FIG. 7 is a cutaway perspective view of a packaged integrated circuit including a heat sink with a plurality of locking moats according to another embodiment of the invention.

FIG. 7 is a cutaway perspective view of packaged integrated circuit 700 including heat sink 710 with a plurality of locking moats 712 according to another embodiment of the invention. Packaged integrated circuit 700 is similar to packaged integrated circuits 100 and 200 and like numerals are used to describe like elements in FIGS. 1, 2A, 2B and 7. Some of the features of packaged integrated circuit 700, e.g., bond wires, have been eliminated to simplify FIG. 7. Additionally, in packaged integrated circuit 700, there is no generally conductive layer 206 and associated dielectric layers 204 and 208 as in packaged integrated circuit 200, though it is to be understood that these could be included.

Locking moats 712 can have any of the cross-sectional shapes described above. Any number of locking moats 712 can be formed; however, no locking moats 712 are formed under package leads 102 and, if applicable, there must be adequate room on heat sink surface 710a to allow bonding to heat sink 710. Locking moats 712 can be formed on any number of sides of die 101, and a different number of locking moats 712 can be formed on different sides of die 101. The exact dimensions of locking moats 712 are not critical to the invention, and locking moats 712 need not each have the same dimensions or shape.

Figure 8:
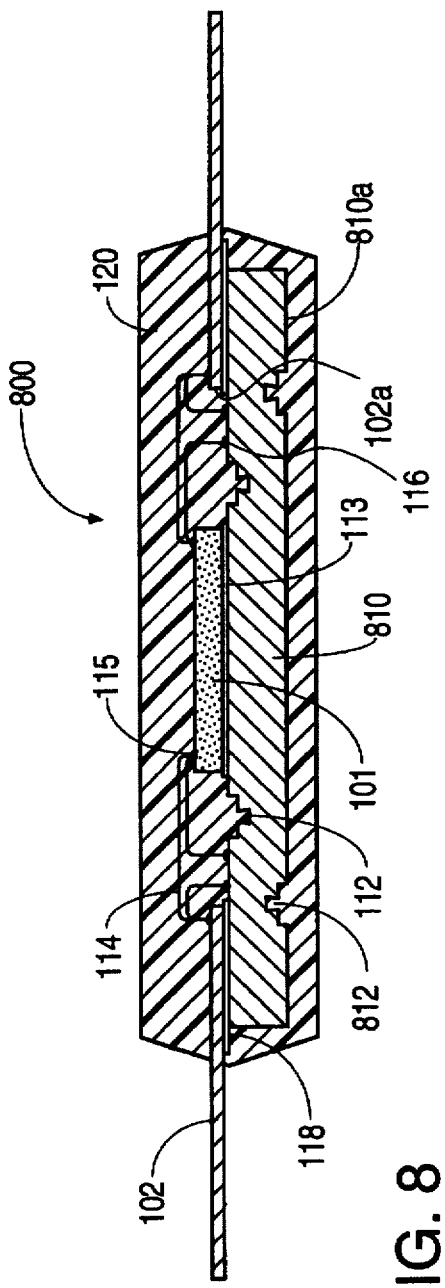
FIG. 8 is a cross-sectional view of a packaged integrated circuit including a heat sink with a locking moat according to another embodiment of the invention.

FIG. 8 is a cross-sectional view of packaged integrated circuit 800 including a heat sink 810 with a locking moat 812 according to another embodiment of the invention. FIG. 8 is similar to FIG. 1 and like elements are designated by the same numerals in FIGS. 1 and 8. Unlike surface 110a of heat sink 110 of FIG. 1, surface 810a of heat sink 810 is not exposed to the exterior of encapsulant 120. Locking moat 812 is formed in surface 810a of heat sink 810 and has the same shape as locking moat 112. Locking moat 812 increases the resistance to delamination of heat sink 810 from encapsulant 820.

Locking moat 812 can be shaped and formed in any of the ways described above. Locking moat 812 need not have the same shape as locking moat 112. A locking moat can be formed on any number of sides of die 101 and any number of locking moats 812 can be formed on each side. The exact dimensions of locking moat 812 are not critical to the invention. Further, rather than a locking moat 812, a locking region, as described above, can be formed in surface 810a. Also, generally conductive and dielectric layers can be added to packaged integrated circuit 800, as described above.

Various embodiments of the invention have been described. The descriptions are intended to be illustrative, not limitative. Thus, it will be apparent to one skilled in the art that certain modifications may be made to the invention as described without departing from the scope of the claims set out below.

I claim:

1. Structure comprising:

a semicondcutor die, the die having a first surface on which electrically conductive traces and a plurality of electrically conductive bond pads are formed, and a second surface, the second surface being opposite the first surface;

a plurality of electrically conductive package leads, a lead tip of each of the package leads in proximity to the die;

a plurality of electrically conductive bond wires, each bond wire connecting the lead tip of one of the package leads to a bond pad on the die;

a heat sink, a first surface of the heat sink attached to the second surface of the die and to an inner portion of the leads, wherein a locking moat is formed in a locking surface of the heat sink between the die and the lead tips of the package leads, the locking moat having a cross-sectional shape, in a plane perpendicular to the locking surface, that has, at a first distance from the locking surface, a width that is larger than a width at a second distance from the locking surface, the second distance being smaller than the first distance;

encapsulant encapsulating the die, the bond wires, the heat sink and the inner portion of the package leads such that the encapsulant interlocks with the locking moat to prevent the encapsulant from separating from the heat sink;

a second plurality of electrically conductive bond wires, each bond wire of the second plurality connecting the lead tip of one of the package leads to a bonding location on the heat sink; and a third plurality of electrically conductive bond wires, each bond wire of the third plurality connecting a bonding location on the heat sink to a bond pad on the die.

2. Structure as in claim 1, wherein a plurality of locking moats are formed in the locking surface.

3. Structure as in claim 1, wherein the locking moat has a keyhole cross-sectional shape.

4. Structure as in claim 1, wherein the cross-sectional shape of the locking moat is a portion of a circle.

5. Structure comprising:

a semicondcutor die, the die having a first surface on which electrically conductive traces and a plurality of electrically conductive bond pads are formed, and a second surface, the second surface being opposite the first surface;

a plurality of electrically conductive package leads, a lead tip of each of the package leads in proximity to the die;

a plurality of electrically conductive bond wires, each bond wire connecting the lead tip of one of the package leads to a bond pad on the die;

a heat sink, a first surface of the heat sink attached to the second surface of the die and to an inner portion of the leads, wherein a locking moat is formed in a locking surface of the heat sink between the die and the lead tips of the package leads, the locking moat having a cross-sectional shape, in a plane perpendicular to the locking surface, that has, at a first distance from the locking surface, a width that is larger than a width at a second distance from the locking surface, the second distance being smaller than the first distance;

encapsulant encapsulating the die, bond wires, heat sink and the inner portion of the package leads such that the encapsulant interlocks with the locking moat to prevent the encapsulant from separating from the heat sink;

a generally conductive layer formed around the periphery of the die; and a second plurality of electrically conductive bond wires, each of the bond wires of the second plurality connecting any two of the lead tip of a package lead, a bonding location on the generally conductive layer, a bonding location on the heat sink, and a bond pad on the die.

6. Structure comprising:

a semiconductor die, the die having a first surface on which electrically conductive traces and a plurality of electrically conductive bond pads are formed, and a second surface, the second surface being opposite the first surface;

a plurality of electrically conductive package leads, a lead tip of each of the package leads in proximity to the die;

a plurality of electrically conductive bond wires, each bond wire connecting the lead tip of one of the package leads to a bond pad on the die;

a heat sink, a first surface of the heat sink attached to the second surface of the die and to an inner portion of the leads, wherein a locking region is formed in a locking surface of the heat sink between the die and the lead tips of the package leads, the locking region including a plurality of depressions formed in the locking surface;

encapsulant encapsulating the die, bond wires, heat sink and the inner portion of the package leads such that the encapsulant interlocks with the locking region to prevent the encapsulant from separating from the heat sink;

a generally conductive layer formed around the periphery of the die; and a second plurality of electrically conductive bond wires, each of the bond wires of the second plurality connecting any two of the lead tip of a package lead, a bonding location on the generally conductive layer, a bonding location on the heat sink, and a bond pad on the die.

7. Structure comprising:

a semiconductor die, the die having a first surface on which electrically conductive traces and a plurality of electrically conductive bond pads are formed, and a second surface, the second surface being opposite the first surface;

a plurality of electrically conductive package leads, a lead tip of each of the package leads in proximity to the die;

a plurality of electrically conductive bond wires, each bond wire connecting the lead tip of one of the package leads to a bond pad on the die;

a heat sink, a first surface of the heat sink attached to the second surface of the die and to an inner portion of the leads, wherein a locking region is formed in a locking surface of the heat sink between the die and the lead tips of the package leads, the locking region including a plurality of depressions formed in the locking surface;

encapsulant encapsulating the die, bond wires, heat sink and the inner portion of the package leads such that the encapsulant interlocks with the locking means to prevent the encapsulant from separating from the heat sink; and wherein the locking region includes a plurality of holes, each hole having a depth and a diameter, the ratio of the depth to the diameter being greater than or equal to 3:1.

8. Structure as in claim 6, wherein the locking region includes a plurality of dimples.

9. Structure as in claim 8, wherein the dimples are formed in a single row approximately parallel to a proximal edge of the die.

10. Structure as in claim 8, wherein the dimples are formed in a plurality of rows, each row being approximately parallel to a proximal edge of the die.

11. Structure as in claim 6, wherein the locking region is an area of the locking surface that has been roughened to form alternating raised and lowered sections.

12. Structure as in claim 6, wherein the locking region is an area of the locking surface that has been formed to have alternating raised and lowered sections arranged in a regular pattern.

13. A heat sink wherein:

a locking region is formed in a locking surface of the heat sink;

the locking region including a plurality of depressions; and wherein the depressions comprise a plurality of holes, each hole having a depth and a diameter, the ratio of the depth to the diameter being greater than or equal to 3:1.

* * * * *